(12) United States Patent
Endo et al.

(10) Patent No.: US 7,141,273 B2
(45) Date of Patent: Nov. 28, 2006

(54) CURABLE ORGANOPOLYSILOXANE COMPOSITION AND SEMICONDUCTOR DEVICE

(75) Inventors: Akihiro Endo, Annaka (JP); Kunihiko Mita, Annaka (JP); Akio Nakano, Annaka (JP); Kunihiro Yamada, Takasaki (JP); Hiroaki Kizaki, Annaka (JP); Hiroaki Tetsuka, Saitama (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 97 days.

(21) Appl. No.: 10/958,251

(22) Filed: Oct. 6, 2004

(65) Prior Publication Data

US 2005/0084691 A1     Apr. 21, 2005

(30) Foreign Application Priority Data

Oct. 7, 2003   (JP) .............................. 2003-347802

(51) Int. Cl.
*B05D 3/02* (2006.01)
(52) U.S. Cl. .................. 427/387; 524/438; 524/439; 524/588; 528/15; 528/31; 528/32; 428/447
(58) Field of Classification Search .................. None
See application file for complete search history.

(56) References Cited

U.S. PATENT DOCUMENTS 6,624,224 B1   9/2003   Misra

2005/0040507 A1 *   2/2005   Matayabas et al. ......... 257/678
2005/0228097 A1 *   10/2005  Zhong ........................ 524/430

FOREIGN PATENT DOCUMENTS

| EP | 0 696 630 A2 | 2/1996 |
| JP | 7-207160 | 8/1995 |
| WO | WO 2004/008497 A2 * | 7/2003 |

* cited by examiner

*Primary Examiner*—Marc S. Zimmer
(74) *Attorney, Agent, or Firm*—Oblon, Spivak, McClelland, Maier & Neustadt, P.C.

(57) ABSTRACT

Provided is a curable organopolysiloxane composition which includes (A) an organopolysiloxane containing at least 2 alkenyl groups bonded to silicon atoms within each molecule, (B) an organohydrogenpolysiloxane containing at least 2 hydrogen atoms bonded to silicon atoms within each molecule, (C) gallium and/or an alloy thereof, with a melting point within a range from 0 to 70° C., optionally (D) a heat conductive filler with an average particle size within a range from 0.1 to 100 μm, (E) a platinum based catalyst, and (F) an addition reaction control agent. The composition is useful as a material capable of forming a layer with excellent thermal conductivity that is sandwiched between a heat generating electronic component and a heat radiating member.

11 Claims, 1 Drawing Sheet

CURABLE ORGANOPOLYSILOXANE COMPOSITION AND SEMICONDUCTOR DEVICE

BACKGROUND OF THE INVENTION

1. Field of the Invention

The present invention relates to a curable organopolysiloxane composition, a method of producing such a composition, a cured product thereof, the use of such a cured product as a heat conductive layer, a semiconductor device containing such a heat conductive layer, and a method of producing such a semiconductor device.

2. Description of the Prior Art

Heat generating electronic components mounted on printed wiring boards, including IC packages such as CPUs, undergo an increase in temperature as a result of the heat generated during operation of the component, and because this temperature increase can cause deterioration in the component performance or even failure of the component, a heat conductive sheet with good thermal conductivity or a heat conductive grease is usually sandwiched between the IC package and a heat radiating member with heat radiating fins, thereby efficiently conducting the heat generated by the IC package or the like through to the heat radiating member, which then radiates the heat away. However, as the performance of electronic components and the like improves, the heating value of the components also tends to increase, meaning there is a demand for the development of materials and members with even better thermal conductivity than conventional materials.

Conventional heat conductive sheets offer workability advantages as they are easily mounted and installed. Furthermore, heat conductive greases offer other advantages in that they are unaffected by irregularities in the surfaces of the CPU or the heat radiating member, and conform to, and follow these irregularities, meaning the two components can be held together without any intervening gaps, thus ensuring a small interface thermal resistance. However, heat conductive sheets and heat conductive greases both require the addition of a heat conductive filler in order to achieve thermal conductivity, and because the apparent viscosity of either material must be restricted to a certain upper limit, in order to prevent any obstacles to workability or processability within the production process in the case of a heat conductive sheet, and in order to prevent any workability problems during application by syringe to a heat generating component in the case of a heat conductive grease, there is a limit to how much heat conductive filler can be added to either material, meaning a favorable thermal conductivity effect cannot be achieved.

As a result, methods of blending a low melting point metal into a heat conductive paste (patent reference 1, patent reference 2), and a particle-based material that fixes and stabilizes a liquid metal within a three phase complex (patent reference 3) have been proposed. However, these heat conductive materials that use low melting point metals have a number of drawbacks including contamination of components other than the coated component, and bleeding of oily material if used for extended periods.

[Patent Reference 1]
JP7-207160A
[Patent Reference 2]
EP 0696630
[Patent Reference 3]
U.S. Pat. No. 6,624,224

SUMMARY OF THE INVENTION

Based on these problems associated with the conventional technology, a primary object of the present invention is to provide a curable organopolysiloxane composition comprising an adequate quantity of a material with excellent thermal conductivity, wherein that material is dispersed uniformly as fine particles within the matrix formed from the resin component. Furthermore, another object of the present invention is to provide a method of producing such a curable organopolysiloxane composition.

Furthermore, another object of the present invention is to propose a use for the above curable organopolysiloxane composition as a heat conductive layer, wherein the composition is sandwiched between a heat generating electronic component and a heat radiating member, and conforms to, and follows the irregularities in the surfaces of the component or the member leaving no intervening gaps, in a similar manner to a conventional heat conductive grease, and is then converted to a cross-linked cured product by heat treatment. In addition, another object of the present invention is to provide a semiconductor device with excellent heat radiating performance, wherein a heat generating electronic component and a heat radiating member are bonded together with an aforementioned heat conductive layer disposed therebetween, as well as a method of producing such a semiconductor device.

[Means for Solution of the Problems]

As a result of intensive investigations aimed at achieving the above objects, the inventors of the present invention discovered that by selecting low melting point gallium and/or an alloy thereof as a material with excellent thermal conductivity, and then blending this material with an addition reaction addition reaction curing type organopolysiloxane composition, a composition could be obtained in which the gallium and/or alloy thereof is dispersed uniformly as fine particles.

Moreover, the inventors also discovered that in the step for heat treating the above composition to generate a cured product, liquid gallium and/or the alloy thereof flocculate and form liquid particles of large particle diameter, and these liquid particles then interconnect, forming a type of pathway. Furthermore, they also discovered that this pathway type structure becomes fixed and supported within the cross-linked network structure that is formed upon curing of the resin component.

Furthermore, the inventors also discovered that by sandwiching a layer of a cured product produced in the manner described above between a heat generating electronic component and a heat radiating member, the cured product could be used as a heat conductive layer with low thermal resistance, and that the heat generated during operation of the heat generating electronic component could be conducted rapidly through the heat conductive layer, comprising the gallium and/or alloy thereof fixed and supported within the structure described above, and into the heat radiating member, thus providing a semiconductor device with excellent heat radiating characteristics, and based on these discoveries, they were able to complete the present invention.

In other words, a first aspect of the present invention provides a curable organopolysiloxane composition comprising:

(A) 100 parts by mass of an organopolysiloxane containing at least 2 alkenyl groups bonded to silicon atoms within each molecule, (B) an organohydrogenpolysiloxane containing at least 2 hydrogen atoms bonded to silicon atoms within each molecule, in sufficient quantity to provide 0.1 to 5.0 hydrogen atoms bonded to silicon atoms within the component (B) for each alkenyl group bonded to a silicon atom within the component (A), (C) 300 to 5000 parts by mass of gallium and/or an alloy thereof, with a melting point within a range from 0 to 70° C., (D) 0 to 1000 parts by mass of a heat conductive filler with an average particle size within a range from 0.1 to 100 μm, (E) an effective quantity of a platinum based catalyst, and (F) an effective quantity of an addition reaction control agent.

A second aspect of the present invention provides a method of producing the above composition.

A third aspect of the present invention provides a heat conductive cured product of the above composition.

A fourth aspect of the present invention provides the use of the above heat conductive cured product as a heat conductive layer for sandwiching between a heat generating electronic component and a heat radiating member.

A fifth aspect of the present invention provides a semiconductor device comprising a heat generating electronic component, a heat radiating member, and the above heat conductive layer.

A sixth aspect of the present invention provides a method of producing the above semiconductor device.

[Effects of Invention]

A curable organopolysiloxane composition of the present invention exists in either a grease form or a paste form prior to curing, and consequently displays favorable workability during application to a heat generating electronic component such as an IC package, and furthermore during subsequent pressure welding of a heat radiating member, also conforms to, and follows the irregularities in the surfaces of the component or the member, thus holding the two members together with no intervening gaps, and preventing interface thermal resistance.

Furthermore, in the heat treatment step during curing of the resin component by an addition reaction, the fine liquid particles of gallium and or an alloy thereof incorporated within the composition of the present invention flocculate and form liquid particles of large particle diameter, and these liquid particles then interconnect, forming a type of pathway, and this pathway type structure becomes fixed and supported within the three dimensional cross-linked network structure that is formed upon curing of the resin component, meaning the heat generated by the heat generating electronic component can be conducted rapidly through to the heat radiating member, thus enabling the reliable manifestation of a heat radiating effect that is superior to that provided by conventional heat conductive sheets or heat conductive greases. The gallium and/or alloy thereof that forms the above pathway within the heat conductive layer formed from a cured product of a composition of the present invention, which is incorporated within the semiconductor device, is fixed and supported within the three dimensional cross-linked network structure of cured resin, and consequently the problems associated with conventional greases such as the contamination of other components or the bleeding of oily material over time, can be avoided. Accordingly, the reliability of the semiconductor device can be further improved.

DETAILED DESCRIPTION OF THE PREFERRED EMBODIMENTS

<(A) Organopolysiloxane>

Figure 1:
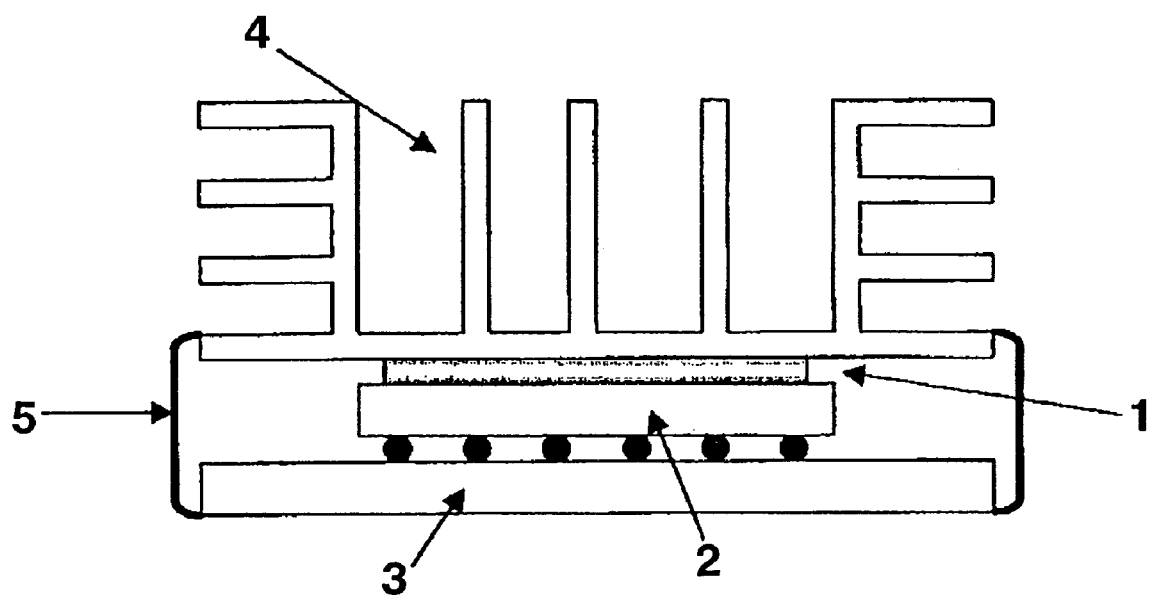
FIG. 1 is a schematic longitudinal cross-sectional view showing one example of a semiconductor device using a composition of the present invention.

The component (A) of a composition of the present invention is an organopolysiloxane containing at least 2 alkenyl groups bonded to silicon atoms within each molecule, and is the primary component (the base polymer) within an addition reaction curing system of the present invention.

There are no particular restrictions on the molecular structure of the organopolysiloxane, provided it is in liquid form, and straight chains, branched chains, and straight chains with partial branching are all suitable, although straight chain structures are particularly preferred.

Examples of the alkenyl groups include vinyl groups, allyl groups, 1-butenyl groups, and 1-hexenyl groups. Of these, vinyl groups, which are very flexible in terms of their use, are preferred. These alkenyl groups may be bonded to either silicon atoms at the molecular chain terminals, or non-terminal silicon atoms within the molecular chain, although in order to ensure good flexibility of the resulting cured product, materials in which the alkenyl groups are bonded only to silicon atoms at the molecular chain terminals are preferred.

Examples of groups other than the alkenyl groups which are bonded to silicon atoms within the component (A) include unsubstituted or substituted monovalent hydrocarbon groups, and specific examples include alkyl groups such as methyl groups, ethyl groups, propyl groups, butyl groups, pentyl groups, hexyl groups, heptyl groups, octyl groups, nonyl groups, decyl groups and dodecyl groups; cycloalkyl groups such as cyclopentyl groups and cyclohexyl groups; aryl groups such as phenyl groups, tolyl groups, xylyl groups and naphthyl groups; aralkyl groups such as benzyl groups, 2-phenethyl groups, and 2-phenylpropyl groups; and halogenated alkyl groups such as chloromethyl groups, 3,3,3-trifluoropropyl groups and 3-chloropropyl groups. From the viewpoints of ease of synthesis and economic viability, at least 90% of these other groups are preferably methyl groups.

Furthermore, the viscosity at 25° C. of this organopolysiloxane is typically within a range from 0.05 to 100 Pa·s, and preferably from 0.5 to 50 Pa·s. If this viscosity is too low, then the storage stability of the obtained composition deteriorates, whereas if the viscosity is too high, then the extensibility of the obtained composition may worsen.

Specific examples of preferred forms of this organopolysiloxane include polydimethylsiloxane with both molecular chain terminals blocked with dimethylvinylsiloxy groups, polydimethylsiloxane with both molecular chain terminals blocked with methyldivinylsiloxy groups, and copolymers of dimethylsiloxane and methylphenylsiloxane with both molecular chain terminals blocked with dimethylvinylsiloxy groups.

This organopolysiloxane of the component (A) can use either a single material, or a combination of two or more different materials with, for example, different viscosities.

<(B) Organohydrogenpolysiloxane>

The component (B) of a composition of the present invention is an organohydrogenpolysiloxane containing at least 2 hydrogen atoms bonded to silicon atoms (hereafter referred to as "SiH groups") within each molecule, which functions as a cross-linking agent for the above component (A). In other words, under the action of the platinum based catalyst of the component (E) described below, the SiH groups of the component (B) undergo a hydrosilylation reaction with the alkenyl groups of the component (A), thus forming a cross-linked cured product comprising a three dimensional network structure containing cross-linked bonds.

Examples of groups other than the hydrogen atoms which are bonded to silicon atoms within the component (B) include unsubstituted or substituted monovalent hydrocarbon groups other than alkenyl groups, and specific examples include the same groups as those described in relation to the component (A). Of these, from the viewpoints of ease of synthesis and economic viability, methyl groups are preferred.

Furthermore, the structure of the organohydrogenpolysiloxane may be a straight chain, branched chain, or cyclic structure.

Specific examples of known organohydrogenpolysiloxanes that can be used as the component (B) include methylhydrogenpolysiloxane with both molecular chain terminals blocked with trimethylsiloxy groups, copolymers of dimethylsiloxane and methylhydrogensiloxane with both molecular chain terminals blocked with trimethylsiloxy groups, copolymers of dimethylsiloxane, methylhydrogensiloxane and methylphenylsiloxane with both molecular chain terminals blocked with trimethylsiloxy groups, dimethylpolysiloxane with both molecular chain terminals blocked with dimethylhydrogensiloxy groups, copolymers of dimethylsiloxane and methylhydrogensiloxane with both molecular chain terminals blocked with dimethylhydrogensiloxy groups, copolymers of dimethylsiloxane and methylphenylsiloxane with both molecular chain terminals blocked with dimethylhydrogensiloxy groups, and methylphenylpolysiloxane with both molecular chain terminals blocked with dimethylhydrogensiloxy groups. Furthermore, the organohydrogenpolysiloxane of the component (B) can use either a single material, or a combination of two or more different materials.

The quantity added of the component (B) is sufficient to provide from 0.1 to 5.0, and preferably from 0.5 to 3.0, hydrogen atoms bonded to silicon atoms within this component (B) for each alkenyl group within the component (A). If this number is less than 0.1, then a satisfactory network structure is not formed, meaning the required level of hardness is not achieved following curing, and making the fixing and supporting of the component (C) described below more difficult. In contrast, if the number exceeds 5.0, then the variation over time in the physical properties of the resulting cured product tends to increase, and the storage stability may deteriorate.

<(C) Gallium and/or an Alloy Thereof>

The component (C) of a composition of the present invention is gallium and/or an alloy thereof, with a melting point within a range from 0 to 70° C. This component (C) is added to impart a favorable level of thermal conductivity to the cured product produced from the composition of the present invention, and the addition of this component is a characteristic feature of the present invention.

As described above, the melting point of this component (C) must fall within a range from 0 to 70° C. Following preparation of a composition of the present invention, in order to retain the state of dispersion of the various components contained within the composition, the composition must be held at a low temperature of approximately −30 to −10° C., and preferably from −25 to −15° C., during extended storage or during transport, and if the above melting point is less than 0° C., then during this type of extended storage or transport, the fine liquid particles become prone to flocculation, making it comparatively difficult to maintain the state obtained at the time of preparation. In contrast, if the above melting point exceeds 70° C., then the component does not melt readily during the composition preparation process, resulting in inferior levels of workability. Accordingly, ensuring a melting point within the above range from 0 to 70° C. satisfies the necessary handling requirements, and is also a suitable range. Materials with a melting point within a range from 15 to 50° C. offer both easier preparation of a composition of the present invention, and simpler handling during extended storage or transport, and also provide more ready formation of the heat conductive pathways generated by flocculation and interconnection of the fine liquid particles of the component (C) under the heating conditions used during curing of the composition, and are consequently particularly preferred.

The melting point of metallic gallium is 29.8° C. Furthermore, representative examples of gallium alloys include gallium-indium alloys (for example, Ga—In: mass ratio=75.4:24.6, melting point=15.7° C.), gallium-tin alloys, gallium-tin-zinc alloys (for example, Ga—Sn—Zn: mass ratio=82:12:6, melting point=17° C.), gallium-indium-tin alloys (for example, Ga—In—Sn: mass ratio=21.5:16.0:62.5, melting point=10.7° C.), and gallium-indium-bismuth-tin alloys (for example, Ga—In—Bi—Sn: mass ratio=9.4:47.3:24.7:18.6, melting point=48.0° C.).

This component (C) can use either a single material, or a combination of two or more different materials.

The fine liquid particles or fine solid particles of gallium or the alloy thereof that exist within the uncured composition of the present invention are of a substantially spherical shape, although irregular shaped particles may also exist. Furthermore, the average particle size is typically within a range from 0.1 to 100 μm, and preferably from 5 to 50 μm. If this average particle size is too small, then the viscosity of the composition becomes overly high, causing the extensibility to deteriorate, and making application of the composition problematic, whereas in contrast, if the average particle size is too large, then the uniformity of the composition is lost, meaning the application of a uniform thin film onto a heat generating electronic component becomes difficult. The shape and average particle size of the particles, together with the state of dispersion of the particles within the composition, can be maintained by storing the composition at low temperature immediately following preparation, and maintaining this storage state until the composition is applied to a heat generating electronic component or the like.

The quantity added of the component (C) is typically within a range from 300 to 5000 parts by mass, and preferably from 500 to 3000 parts by mass, per 100 parts by mass of the component (A). If this quantity is less than 300 parts by mass, then not only is the viscosity of the liquid composition too low, meaning a grease-like consistency cannot be achieved, and making it difficult to form a heat conductive layer of the required thickness on the heat generating electronic component or the like, but a cured product with satisfactory thermal conductivity can also not be obtained. In contrast, if the quantity is too large, then dispersing and mixing the component (C) within the component (A) to generate a uniform composition becomes difficult. Furthermore, the viscosity of the composition also becomes overly high, meaning producing the composition as a grease with favorable extensibility becomes difficult.

<(D) Heat Conductive Filler>

Where required, the type of heat conductive filler (D) that is typically added to conventional heat conductive sheets or heat conductive greases can also be added to a composition of the present invention, together with the aforementioned component (C). If this type of component (D) is added, then during the conversion of the composition of the present invention to a cured product by heat treatment, when the fine particles of the component (C) flocculate and form liquid particles of large particle diameter, linking occurs not only between liquid particles of the component (C), but also between the liquid particles of the component (C) and the component (D), meaning a type of heat conductive pathway becomes fixed and supported within the cross-linked network structure of the cured product.

There are no particular restrictions on the material of the component (D), provided it has favorable thermal conductivity, and any of the conventionally used materials can be used. Suitable examples include aluminum powder, zinc oxide powder, alumina powder, boron nitride powder, aluminum nitride powder, silicon nitride powder, copper powder, silver powder, diamond powder, nickel powder, zinc powder, stainless steel powder, and carbon powder. Furthermore, the component (D) can use either a single material, or a combination of two or more different materials.

If a material such as aluminum which displays high reactivity with gallium is used, then flocculation can occur during the mixing step in the preparation of the composition, making it difficult to achieve uniform mixing. In such cases, the fine liquid particles of the component (C) should be first dispersed uniformly within the component (A), and once the component (C) has been coated by the component (A), the component (D) can then be added and mixed into the composition. This enables flocculation of the component (D) to be suppressed.

The average particle size of the component (D) is typically within a range from 0.1 to 100 μm, and preferably from 1 to 20 μm. If this average particle size is too small, then the viscosity of the product composition becomes overly high, causing the extensibility to deteriorate. In contrast, if the average particle size is too large, then obtaining a uniform composition becomes difficult.

In those cases where a component (D) is used, the quantity of the component (D) is typically 10 parts by mass or more but no more than 1000 parts by mass, and preferably 25 parts by mass or more but no more than 500 parts by mass, per 100 parts by mass of the component (A). If the quantity added exceeds 1000 parts by mass, then the extensibility of the obtained composition tends to be poor. In addition, the interconnection of particles of the component (D) via the component (C), under the heat treatment conditions used during curing, deteriorates and becomes inadequate, and the flocculation of the fine liquid particles of the component (C) is also inhibited, meaning it becomes difficult to form the desired heat conductive pathway, thus resulting in a decrease in the heat radiating performance of the cured product layer formed from the composition of the present invention.

<(E) Platinum Based Catalyst>

The platinum based catalyst of the component (E) of a composition of the present invention accelerates the addition reaction between the alkenyl groups within the component (A) and the SiH groups within the component (B), and is added to promote the formation of a cross-linked cured product with a three dimensional network structure from the composition of the present invention.

Any of the catalysts typically used in conventional hydrosilylation reactions can be used as this component (E), and suitable examples include metallic platinum (platinum black), chloroplatinic acid, platinum-olefin complexes, platinum-alcohol complexes and platinum coordination compounds. There are no particular restrictions on the quantity added of the component (E), which need only be an effective catalytic quantity required to cure the composition of the present invention, although a typical quantity, calculated as the mass of platinum atoms relative to the mass of the component (A), is within a range from 0.1 to 500 ppm.

<(F) Addition Reaction Control Agent>

The addition reaction control agent of the component (F) of a composition of the present invention inhibits the hydrosilylation caused by the aforementioned platinum based catalyst from occurring at room temperature, thus enhancing the usable life (shelf life, pot life) of the composition of the present invention, and is added to ensure that no problems arise during the application of the composition to a heat generating electronic component or the like.

Any of the conventional addition reaction control agents used in typical addition reaction curing type silicone compositions can be used as this component (F), and suitable examples include acetylene compounds such as 1-ethynyl-1-cyclohexanol and 3-butyn-1-ol, as well as a variety of nitrogen compounds, organic phosphorus compounds, oxime compounds, and organic chloro compounds.

The quantity added of this component (F) cannot be generalized, and varies depending on the quantity used of the aforementioned component (E), although any quantity that is effective in inhibiting the progression of the hydrosilylation reaction can be used. Typically, a quantity within a range from 0.001 to 5 parts by mass per 100 parts by mass of the component (A) is suitable. If the quantity of the component (F) is too small, then a satisfactory usable life cannot be ensured, whereas if the quantity is too large, the curability of the composition of the present invention tends to deteriorate. In order to improve the dispersibility within the composition, where required, this component (F) may be diluted with an organic solvent such as toluene, xylene or isopropyl alcohol.

<(G) Surface Treatment Agent>

If required, a surface treatment agent (G) (a wetter) may also be added to a composition of the present invention, with the objects of subjecting the gallium and/or alloy thereof of the component (C) to hydrophobic treatment during the preparation of the composition, thereby improving the wettability of the liquid particles of the component (C) by the organopolysiloxane of the component (A), and enabling the component (C) to be uniformly dispersed, as fine particles, within the matrix formed from the component (A).

Furthermore, in those cases where a heat conductive filler of the aforementioned component (D) is used, this component (G) also improves the wettability of the surface of the component (D), thereby ensuring favorable dispersibility of the component (D).

Examples of the component (G) include the alkoxysilane compounds (G-1) represented by a general formula (1) shown below:

$$R^1_a R^2_b Si(OR^3)_{4-a-b} \quad (1)$$

(wherein, each $R^1$ represents, independently, an alkyl group of 6 to 15, and preferably from 8 to 14, carbon atoms, each $R^2$ represents, independently, an unsubstituted or substituted monovalent hydrocarbon group of 1 to 8, and preferably from 1 to 6, carbon atoms, each $R^3$ represents, independently, an alkyl group of 1 to 6, and preferably from 1 to 4, carbon atoms, a represents an integer from 1 to 3, b represents an integer from 0 to 2, and the sum of a+b is an integer from 1 to 3).

Specific examples of $R^1$ in the above formula include hexyl groups, octyl groups, nonyl groups, decyl groups, dodecyl groups and tetradecyl groups. If the number of carbon atoms is less than 6, then the improvement in the wetting of the components (C) and (D) is inadequate, whereas if the number of carbon atoms exceeds 15, then the organosilane of the component (G-1) becomes solid at room temperature, which makes handling a problem, and impairs the low temperature characteristics of the product composition.

Specific examples of $R^2$ in the above formula include alkyl groups such as methyl groups, ethyl groups, propyl groups, hexyl groups and octyl groups; cycloalkyl groups such as cyclopentyl groups and cyclohexyl groups; alkenyl groups such as vinyl groups and allyl groups; aryl groups such as phenyl groups and tolyl groups; aralkyl groups such as 2-phenylethyl groups and 2-methyl-2-phenylethyl groups; and halogenated hydrocarbon groups such as 3,3,3-trifluoropropyl groups, 2-(nonafluorobutyl)ethyl groups, 2-(heptadecafluorooctyl)ethyl groups and p-chlorophenyl groups. Of these, methyl groups and ethyl groups are particularly preferred.

Specific examples of $R^3$ in the above formula include alkyl groups such as methyl groups, ethyl groups, propyl groups, butyl groups, pentyl groups and hexyl groups. Of these, methyl groups and ethyl groups are particularly preferred.

Specific examples of preferred forms of this component (G-1) include the compounds shown below.

$C_6H_{13}Si(OCH_3)_3$  $C_{10}H_{21}Si(OCH_3)_3$
$C_{12}H_{25}Si(OCH_3)_3$  $C_{12}H_{25}Si(OC_2H_5)_3$
$C_{10}H_{21}Si(CH_3)(OCH_3)_2$
$C_{10}H_{21}Si(C_6H_5)(OCH_3)_2$
$C_{10}H_{21}Si(CH_3)(OC_2H_5)_2$
$C_{10}H_{21}Si(CH=CH_2)(OCH_3)_2$
$C_{10}H_{21}Si(CH_2CH_2CF_3)(OCH_3)_2$

This component (G-1) can use either a single compound, or a combination of two or more different compounds. Furthermore, the quantity added of the component (G-1) is preferably within a range from 0.01 to 10 parts by mass, and preferably from 0.1 to 5 parts by mass, per 100 parts by mass of the component (A). If the quantity is too large, then no further improvement is seen in the wetting effect, meaning the addition is simply uneconomical, and because the component also displays some volatility, the composition of the present invention may gradually cure if left in an open system.

Examples of the component (G) other than the aforementioned (G-1), include dimethylpolysiloxanes in which one molecular chain terminal is blocked with a trialkoxysilyl group (G-2), as represented by a general formula (2) shown below:

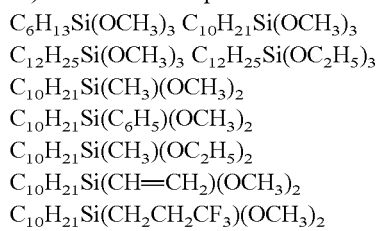

(wherein, each $R^3$ represents, independently, an alkyl group of 1 to 6, and preferably from 1 to 4, carbon atoms, and c represents an integer from 5 to 100, and preferably from 10 to 60).

Specific examples of $R^3$ in the above formula include the same groups as the group $R^3$ in the above general formula (1).

This component (G-2) can use either a single compound, or a combination of two or more different compounds. Furthermore, the quantity added of the component (G-2) is preferably within a range from 0.01 to 20 parts by mass, and preferably from 0.1 to 10 parts by mass, per 100 parts by mass of the component (A). If the quantity is too large, then the thermal resistance of the obtained cured product tends to deteriorate.

A combination of a component (G-1) and a component (G-2) can also be used as the surface treatment agent of the component (G).

<Other Components>

In addition to the various components described above, other components may also be added to a composition of the present invention, provided such addition does not impair the objects or effects of the present invention. Examples include thermal resistance improvement agents such as iron oxide or cerium oxide, viscosity regulators such as silica, and colorants and the like.

<Viscosity of the Composition>

As described below, a composition of the present invention is applied to the surface of a heat generating electronic component, a heat radiating member is then pressure welded onto the composition, and the composition is then cured by heat treatment, thus forming a heat conductive layer. During this process, in order to ensure favorable workability, the composition of the present invention must be in the form of a grease.

For example, the composition of the present invention can be housed within a cylinder, and discharged from this cylinder and onto the surface of the heat generating electronic component such as a CPU or the like to form a coating layer, with the heat radiating member then being pressure welded to this coating layer. Accordingly, the viscosity of the composition of the present invention is typically within a range from 10 to 1000 Pa·s, and preferably from 50 to 400 Pa·s. If this viscosity is too low, then overrun of the liquid occurs during application, and this can cause workability problems. In contrast, if the viscosity is too high, then extrusion of the composition from the cylinder becomes difficult, and the efficiency of the application process may deteriorate.

[Preparation of a Composition of the Present Invention]

A curable organopolysiloxane composition of the present invention can be prepared using a production method comprising the steps of: (i) mixing said component (A) and said component (C), and, if said component (D) is present, optionally a part or the whole of said component (D), at a temperature which is within a range from 40 to 120° C. and which is equal to or greater than a melting point of said component (C), thus yielding a uniform mixture; (ii) halting said mixing, and cooling said mixture to a temperature that is less than said melting point of said component (C); and (iii) adding said component (B), said component (E) and said component (F), and optionally the whole or the remainder of said component (D), if present, and then mixing at a temperature that is less than said melting point of said component (C), thus yielding a uniform mixture.

When said composition further comprises the component (G-1), a part or the whole of said component (G-1) is optionally mixed at the step (i), and the whole or the remainder of said component (G-1), if present, is added at the step (iii). Namely, a part or the whole of the component (G-1) may be added at the step (i). When a part of this component is added at the step (i), the remainder is added at the step (iii). When the component (G-1) is not added at the step (i), the whole of this component is added at the step (iii).

The manner of addition of the component (G-1) is also applied to the addition of the component (G-2). When said composition further comprises the component (G-2), a part or the whole of said component (G-2) is optionally mixed at the step (i), and the whole or the remainder of said component (G-2), if present, is added at the step (iii). Namely, a part or the whole of the component (G-2) may be added at the step (i). When a part of this component is added at the step (i), the remainder is added at the step (iii). When the component (G-1) is not added at the step (i), the whole of this component is added at the step (iii).

Other optional components described above may be added at the step (i) or step (ii), or at both of the steps, as long as the effects or advantages of the present invention are not impaired.

This production method uses a stirring and mixing device such as a conditioning mixer or a planetary mixer equipped with a heating device and, where necessary, a cooling device.

In the above step (i), the liquid form of the gallium and/or alloy thereof of the component (C) is dispersed uniformly as fine particles within a matrix formed from the component (A). By adjusting the temperature during mixing, and the rate of revolution of the stirring blades of the stirring and mixing device, the average particle size of the fine particles can be appropriately adjusted to the desired value.

The temperature lowering or cooling operation in the step (ii) is preferably conducted rapidly. In the step (ii), the component (C), which is uniformly dispersed as fine liquid particles within the matrix formed from the component (A), solidifies, while retaining the average particle size and the state of dispersion described above.

The above step (iii) is also completed within as short a time as possible. At the completion of the step (iii), there is still effectively no variation in the average particle size or the state of dispersion of the solidified fine particles of the component (C). Then, following completion of the step (iii), the produced composition is preferably placed inside a container, and immediately stored in a freezer or cold room at a temperature within a range from −30 to −10° C., and preferably from −25 to −15° C. Furthermore, transport of the composition is also preferably conducted using a vehicle equipped with freezer facilities. By storing and transporting the composition under low temperature conditions in this manner, the composition and dispersion stability of the composition of the present invention can be stably maintained, even over extended periods.

[Application to a Semiconductor Device]

Using an aforementioned composition of the present invention, a semiconductor device with excellent heat radiating characteristics, namely, a semiconductor device comprising a heat generating electronic component, a heat radiating member, and a heat conductive layer formed from a cured product of an aforementioned composition of the present invention, wherein the heat generating electronic component and the heat radiating member are bonded together via the heat conductive layer, can be produced.

This semiconductor device can be obtained using a production method comprising the steps of:
(a) applying the composition to a surface of the heat generating electronic component, thus forming a coating layer of the composition on that surface,
(b) securing the heat radiating member to the coating layer by pressure welding, and
(c) treating the thus obtained structure at a temperature of 80 to 180° C., thus curing the coating layer and generating the heat conductive layer.

The aforementioned semiconductor device and the method of producing the device are described with reference to FIG. 1. The device shown in FIG. 1 is merely one example of the application of a composition of the present invention to a semiconductor device, and a semiconductor device according to the present invention is in no way restricted to the device shown in FIG. 1.

First, the frozen composition of the present invention is placed at room temperature and allowed to thaw naturally to a grease-like state. This liquid composition of the present invention is then placed inside an application tool such as a cylinder.

The composition of the present invention is then discharged from the cylinder onto the surface of a heat generating electronic component, for example, an IC package 2 such as a CPU or the like shown in FIG. 1, which represents a heat generating electronic component mounted on top of a printed wiring board 3, thus forming a coating layer 1. A heat radiating member, typically a heat radiating member 4 with heat dissipating fins made from aluminum, is then placed on top of the coating layer 1, and a clamp 5 is used to pressure weld and secure the heat radiating member 4 to the IC package 2 via the coating layer 1.

In this process, the clamp 5 is adjusted so that the thickness of the coating layer 1 sandwiched between the IC package 2 and the heat radiating member 4 typically falls within a range from 5 to 100 μm, and is preferably from 10 to 30 μm. If this thickness is overly thin, then the ability of the composition of the present invention to conform to, and follow the surfaces of the IC package 2 and the heat radiating member 4 during the pressure welding is unsatisfactory, and there is a danger of gaps appearing between the two members. In contrast, if the layer is overly thick, then the thermal resistance increases, meaning a satisfactory heat radiating effect cannot be achieved.

Subsequently, the thus formed device is passed through a heating device such as a reflow oven, thus curing the coating layer 1 formed from the composition of the present invention and forming a heat conductive layer. The temperature conditions required during this curing step are typically within a range from 80 to 180° C., and preferably from 100 to 150° C. If the temperature is less than 80° C., then the curing is unsatisfactory, whereas at high temperatures exceeding 180° C., there is a danger of causing deterioration in the electronic component or the substrate.

In the above step for curing the composition by raising the temperature under the aforementioned temperature conditions, the fine liquid particles of gallium and/or the alloy thereof, from the component (C) within the composition of the present invention, flocculate and form liquid particles of large particle diameter, and these liquid particles then interconnect, forming a type of pathway. Furthermore, in those cases where the composition of the present invention also incorporates a heat conductive filler of the aforementioned component (D), the liquid particles of the component (C) also link with the component (D), forming a similar interconnected pathway.

In addition, the liquid particles of the component (C) also fuse to the surfaces of the neighboring IC package 2 and heat radiating member 4. Accordingly, the IC package 2 and the heat radiating member 4 are linked together via a type of interconnected pathway formed by the liquid particles of the component (C) (and the heat conductive filler of the component (D)), and display excellent thermal conductivity. Furthermore, this pathway-like structure is fixed and supported within the three dimensional cross-linked network structure of the cured product that is formed by the addition reaction between the component (A) and the component (B).

Furthermore, during operation or use of a semiconductor device produced in the manner described above, the surface temperature of the heat generating electronic component such as an IC package or the like typically reaches a temperature of approximately 60 to 120° C. The heat conductive layer formed from the cured product of the composition of the present invention displays excellent thermal conductivity of this generated heat, and produces heat radiating characteristics that are markedly superior to conventional heat conductive sheets or heat conductive greases. Even when the semiconductor device is operated continuously over extended periods, because the gallium and or alloy thereof of the component (C), which forms the aforementioned pathway within the heat conductive layer, is fixed and supported within the three dimensional cross-linked network structure of the cured product, no bleeding occurs from the heat conductive layer.

Moreover the heat conductive layer is also tacky, so that even if the heat radiating member is slightly offset, and even after extended usage, the conductive layer maintains a stable level of flexibility, and does not separate from either the heat generating electronic component or the heat radiating member.

Similar effects can also be achieved by preparing a sheet-like cured product of a desired thickness from a composition of the present invention, and then sandwiching this sheet between a heat generating electronic component and a heat radiating member in a similar manner to a conventional heat conductive sheet. In addition, a cured sheet or the like formed from a composition of the present invention can also be used as a component within other devices or apparatus that require good thermal conductivity or thermal resistance.

EXAMPLES

As follows is a more detailed description of the present invention, based on a series of examples, although the present invention is in no way restricted to the examples presented below.

The components (A) through (G) that are used in the following examples and comparative examples are listed below.

Component (A):
Dimethylpolysiloxane with both terminals blocked with dimethylvinylsilyl groups, wherein the viscosity at 25° C. is as listed below:
(A-1) viscosity: 0.6 Pa·s
(A-2) viscosity: 3.0 Pa·s
(A-3) viscosity: 10.0 Pa·s
(A-4) viscosity: 30.0 Pa·s Component (B):
(B-1) The organohydrogenpolysiloxane represented by a structure shown below.

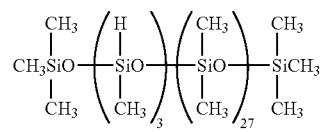

Component (C):
(C-1) metallic gallium (melting point=29.8° C.)
(C-2) Ga—In alloy (mass ratio=75.4:24.6, melting point=15.7° C.)
(C-3) Ga—In—Bi—Sn alloy (mass ratio=9.4:47.3:24.7:18.6, melting point=48.0° C.)
(C-4) metallic indium (melting point=156.2° C.)<for comparison>

Component (D):
(D-1) aluminum powder (average particle size: 1.5 μm)
(D-2) zinc oxide powder (average particle size: 1.0 μm)
(D-3) copper powder (average particle size: 110.2 μm)<for comparison>

Component (E):
A dimethylpolysiloxane (with both terminals blocked with dimethylvinylsilyl groups, viscosity: 0.6 Pa·s) solution of a platinum-divinyltetramethyldisiloxane complex (platinum atom content: 1% by mass)

Component (F):
(F-1) A 50% by mass toluene solution of 1-ethynyl-1-cyclohexanol

Component (G):
(G-1) The organosilane represented by the structural formula $C_{10}H_{21}Si(OCH_3)_3$
(G-2) The dimethylpolysiloxane with one terminal blocked with a trimethoxysilyl group, represented by a structural formula shown below.

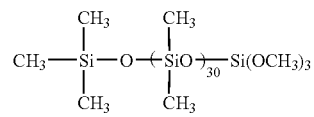

Examples 1 to 20, Comparative Examples 1 to 5

<Preparation of Compositions>
Using the respective compositions and quantities shown in Table 1 through Table 4, compositions were prepared in the manner described below.

In a conditioning mixer with an internal capacity of 250 ml (product name: Hybrid defoaming mixer, manufactured by Thinky Corporation) were placed the component (A), the component (C), and if used, the component (D) and the component (G), and the temperature was then raised to 70° C. and held at that temperature while mixing was conducted for 5 minutes. Subsequently, the mixing was halted, and in the cases of the examples 1 to 6, the examples 14 to 20, and the comparative examples 1 to 5, the temperature was cooled to 25° C. In the cases of the examples 7 to 13, the temperature was cooled to 10° C.

The component (B), the component (E) and the component (F) were then added, and with the above temperature maintained, mixing was conducted to prepare a uniform composition.

The viscosity (Pa·s) at 25° C. of each of the compositions prepared in this manner (excluding the compositions of the comparative example 1 and the comparative example 2) was measured using a Malcolm viscometer (model: PC-1T, manufactured by Malcolm Co., Ltd.). The results of the measurements are shown in Table 1 through Table 4.

<Preparation of Cured Products>

Each of the compositions obtained above (excluding those of the comparative example 1 and the comparative example 2) was applied to the entire surface of a standard aluminum plate, another standard aluminum plate was placed on top, and the plates were then squeezed together with a pressure of approximately 175.5 kPa (1.80 kgf/cm$^2$) to form a 3-layer structure. This structure was then placed in an electric oven, the temperature was raised to 125° C., and this temperature was maintained for 1 hour to cure the composition. The structure was then left to cool to room temperature, thus completing the preparation of a sample for measuring thermal resistance.

The thickness of each of these samples was measured, and the thickness of the cured composition was calculated by subtracting the known thickness for the standard aluminum plates. A micrometer (model: M820-25VA, manufactured by Mitutoyo Corporation) was used for the measurement of the thickness values for each of the samples. The thickness values for each of the cured compositions are shown in Table 1 through Table 4.

<Measurement of Thermal Resistance>

Using the above samples, the thermal resistance (mm$^2$·K/W) of the cured product of each composition was measured using a thermal resistance measuring device (a microflash, manufactured by Holomatrix Co., Ltd.). The results of the measurements are shown in Table 1 through Table 4.

<Application to a Semiconductor Device>

0.2 g of each composition from the examples 1 through 20 was applied to the surface of a 2 cm×2 cm CPU to form a coating layer. A heat radiating member was then overlaid on top of the coating layer, and the layer was pressure welded and cured in the same manner as described above in the preparation of the cured products, thus yielding a semiconductor device in which the CPU and the heat radiating member were bonded together via a heat conductive layer with a thickness of 10 to 40 μm. Each of the produced devices was installed in a host computer or a personal computer or the like and operated, and although the output temperature of the CPU was approximately 100° C., all of the devices were able to be used over an extended period, with stable thermal conductivity and heat radiation, and potential problems such as deterioration in the CPU performance or device failure caused by excessive heat accumulation were able to be prevented. Accordingly, it was confirmed that employing a cured product of a composition of the present invention enables an improvement in the reliability of a semiconductor device.

TABLE 1

| Composition (parts by mass) | | | Example | | | | | |
|---|---|---|---|---|---|---|---|---|
| | | | 1 | 2 | 3 | 4 | 5 | 6 |
| | (A) | A-1 | 100 | 100 | 100 | — | — | — |
| | | A-2 | — | — | — | 100 | — | — |
| | | A-3 | — | — | — | — | 100 | — |
| | | A-4 | — | — | — | — | — | 100 |
| | (B) | B-1 | 11.4 | 11.4 | 11.2 | 4.9 | 3.7 | 2.7 |
| | | SiH/Vi* | 1.0 | 1.0 | 1.0 | 1.0 | 1.0 | 1.0 |
| | (C) | C-1 | 1714 | 1714 | 1800 | 1165 | 923 | 632 |
| | (D) | D-1 | — | 100 | — | — | — | — |
| | | D-2 | 143 | — | — | — | — | — |
| | (E) | E-1 | 0.14 | 0.14 | 0.14 | 0.13 | 0.07 | 0.04 |
| | (F) | F-1 | 0.44 | 0.44 | 0.44 | 0.43 | 0.20 | 0.11 |
| | (G) | G-1 | 3 | 3 | 2 | — | — | — |
| | | G-2 | — | — | — | — | — | — |
| Viscosity (Pa · s) | | | 260 | 289 | 153 | 105 | 104 | 140 |
| Composition layer thickness (μm) | | | 31 | 33 | 25 | 18 | 15 | 14 |
| Thermal resistance (mm$^2$-K/W) | | | 4.4 | 4.6 | 3.8 | 2.7 | 2.5 | 2.3 |

(Note)

SiH/Vi = the number of SiH groups within the component (B) for each vinyl group within the component (A) (this definition also applies below)

TABLE 2

| | | | \multicolumn{7}{c}{Example} |
|---|---|---|---|---|---|---|---|---|---|
| | | | 7 | 8 | 9 | 10 | 11 | 12 | 13 |
| Composition (parts by mass) | (A) | A-1 | 100 | 100 | 100 | 100 | — | — | — |
| | | A-2 | — | — | — | — | 100 | — | — |
| | | A-3 | — | — | — | — | — | 100 | — |
| | | A-4 | — | — | — | — | — | — | 100 |
| | (B) | B-1 | 11.4 | 11.4 | 11.2 | 11.2 | 4.9 | 3.7 | 2.7 |
| | | SiH/Vi* | 1.0 | 1.0 | 1.0 | 1.0 | 1.0 | 1.0 | 1.0 |
| | (C) | C-2 | 1714 | 1714 | 1800 | 1800 | 1165 | 923 | 632 |
| | (D) | D-1 | — | 100 | — | — | — | — | — |
| | | D-2 | 143 | — | — | — | — | — | — |
| | (E) | E-1 | 0.14 | 0.14 | 0.14 | 0.14 | 0.13 | 0.07 | 0.04 |
| | (F) | F-1 | 0.44 | 0.44 | 0.44 | 0.44 | 0.43 | 0.20 | 0.11 |
| | (G) | G-1 | 3 | 3 | 2 | — | — | — | — |
| | | G-2 | — | — | — | 5 | — | — | — |
| Viscosity (Pa·s) | | | 241 | 269 | 133 | 162 | 100 | 98 | 128 |
| Composition layer thickness (μm) | | | 33 | 30 | 26 | 27 | 16 | 14 | 13 |
| Thermal resistance (mm$^2$·K/W) | | | 4.6 | 4.2 | 3.6 | 3.8 | 2.6 | 2.3 | 2.2 |

TABLE 3

| | | | \multicolumn{7}{c}{Example} |
|---|---|---|---|---|---|---|---|---|---|
| | | | 14 | 15 | 16 | 17 | 18 | 19 | 20 |
| Composition (parts by mass) | (A) | A-1 | 100 | 100 | 100 | 100 | — | — | — |
| | | A-2 | — | — | — | — | 100 | — | — |
| | | A-3 | — | — | — | — | — | 100 | — |
| | | A-4 | — | — | — | — | — | — | 100 |
| | (B) | B-1 | 11.4 | 11.4 | 11.2 | 11.2 | 4.9 | 3.7 | 2.7 |
| | | SiH/Vi* | 1.0 | 1.0 | 1.0 | 1.0 | 1.0 | 1.0 | 1.0 |
| | (C) | C-3 | 1714 | 1714 | 1800 | 1800 | 1165 | 923 | 632 |
| | (D) | D-1 | — | 100 | — | — | — | — | — |
| | | D-2 | 143 | — | — | — | — | — | — |
| | (E) | E-1 | 0.14 | 0.14 | 0.14 | 0.14 | 0.13 | 0.07 | 0.04 |
| | (F) | F-1 | 0.44 | 0.44 | 0.44 | 0.44 | 0.43 | 0.20 | 0.11 |
| | (G) | G-1 | 3 | 3 | 2 | — | — | — | — |
| | | G-2 | — | — | — | 5 | — | — | — |
| Viscosity (Pa·s) | | | 266 | 291 | 159 | 181 | 112 | 104 | 137 |
| Composition layer thickness (μm) | | | 33 | 35 | 27 | 27 | 18 | 15 | 14 |
| Thermal resistance (mm$^2$·K/W) | | | 4.6 | 4.9 | 3.6 | 3.6 | 2.6 | 2.4 | 2.2 |

TABLE 4

| | | | \multicolumn{5}{c}{Comparative example} |
|---|---|---|---|---|---|---|---|
| | | | 1 | 2 | 3 | 4 | 5 |
| Composition (parts by mass) | (A) | A-1 | 100 | 100 | — | 100 | 100 |
| | | A-4 | — | — | 100 | — | — |
| | (B) | B-1 | 11.4 | 11.4 | 2.7 | 11.2 | 11.2 |
| | | SiH/Vi* | 1.0 | 1.0 | 1.0 | 1.0 | 1.0 |
| | (C) | C-1 | 6200 | 100 | 50 | 250 | — |
| | | C-4 | — | — | — | — | 2000 |
| | (D) | D-2 | — | — | 230 | 200 | 400 |
| | | D-3 | — | — | — | 4500 | — |
| | (E) | E-1 | 0.14 | 0.14 | 0.04 | 0.14 | 0.14 |
| | (F) | F-1 | 0.44 | 0.44 | 0.11 | 0.44 | 0.44 |
| | (G) | G-1 | 6 | 2 | 2 | 6 | 2 |
| Viscosity (Pa·s) | | | (Note) | (Note) | 321 | 459 | 286 |
| Composition layer thickness (μm) | | | — | — | 18 | 12.1 | 44 |
| Thermal resistance (mm$^2$·K/W) | | | — | — | 15.2 | 16.7 | 12.3 |

(Note)
In the comparative example 1 and the comparative example 2, a uniform grease-like coomposition could not be produced in either case.

What is claimed is:

1. A curable organopolysiloxane composition comprising:
   (A) 100 parts by mass of an organopolysiloxane containing at least 2 alkenyl groups bonded to silicon atoms within each molecule,
   (B) an organohydrogenpolysiloxane containing at least 2 hydrogen atoms bonded to silicon atoms within each molecule, in sufficient quantity to provide from 0.1 to 5.0 hydrogen atoms bonded to silicon atoms within said component (B) for each alkenyl group bonded to a silicon atom within said component (A),
   (C) 300 to 5000 parts by mass of gallium and/or an alloy thereof, with a melting point within a range from 0 to 70° C.,
   (D) 0 to 1000 parts by mass of a heat conductive filler with an average particle size within a range from 0.1 to 100 μm,
   (E) an effective quantity of a platinum based catalyst, and
   (F) an effective quantity of an addition reaction control agent;
   (G-1) 0.01 to 10 parts by mass of an alkoxysilane compound represented by a general formula (1) shown below:

$$R^1_a R^2_b Si(OR^3)_{4-a-b} \tag{1}$$

wherein, each $R^1$ represents, independently, an alkyl group of 6 to 15 carbon atoms, each $R^2$ represents, independently, an unsubstituted or substituted monovalent hydrocarbon group of 1 to 8 carbon atoms, each $R^3$ represents, independently, an alkyl group of 1 to 6 carbon atoms, a represents an integer from 1 to 3, b represents an integer from 0 to 2, and a sum of a+b is an integer from 1 to 3.

2. The curable organopolysiloxane composition according to claim 1, further comprising:
   (G-2) 0.01 to 20 parts by mass of a dimethylpolysiloxane in which one molecular chain terminal is blocked with a trialkoxysilyl group, represented by a general formula (2) shown below:

$$CH_3-(SiO)_c-Si(OR^3)_3 \quad \text{with } CH_3 \text{ groups on Si} \tag{2}$$

wherein, each $R^3$ represents, independently, an alkyl group of 1 to 6 carbon atoms, and c represents an integer from 5 to 100.

3. The curable organopolysiloxane composition according to claim 1, wherein said alloy is at least one selected from the group consisting of a gallium-indium alloy, a gallium-tin alloy, a gallium-tin-zinc alloy, a gallium-indium-tin alloy, and a gallium-indium-bismuth-tin alloy.

4. A method of producing a composition according to claim 1, comprising:
   (i) mixing said component (A) and said component (C), and, if said component (D) is present, optionally a part or the whole of said component (D), at a temperature which is within a range from 40 to 120° C. and which is equal to or greater than a melting point of said component (C), thus yielding a uniform mixture;
   (ii) halting said mixing, and cooling said mixture to a temperature that is less than said melting point of said component (C); and
   (iii) adding said component (B), said component (E) and said component (F), and optionally the whole or the remainder of said component (D), if present, and then mixing at a temperature that is less than said melting point of said component (C), thus yielding a uniform mixture;
   wherein said composition further comprises:
   (G-1) 0.01 to 10 parts by mass of an alkoxysilane compound represented by a general formula (1) shown below:

$$R^1_a R^2_b Si(OR^3)_{4-a-b} \tag{1}$$

wherein, each $R^1$ represents, independently, an alkyl group of 6 to 15 carbon atoms, each $R^2$ represents, independently, an unsubstituted or substituted monovalent hydrocarbon group of 1 to 8 carbon atoms, each $R^3$ represents, independently, an alkyl group of 1 to 6 carbon atoms, a represents an integer from 1 to 3, b represents an integer from 0 to 2, and a sum of a+b is an integer from 1 to 3, and
   wherein a part or the whole of said component (G-1) is optionally mixed at the step (i), and the whole or the remainder of said component (G-1), if present, is added at the step (iii).

5. The method according to claim 4, wherein said composition further comprises:
   (G-2) 0.01 to 20 parts by mass of a dimethylpolysiloxane in which one molecular chain terminal is blocked with a trialkoxysilyl group, represented by a general formula (2) shown below:

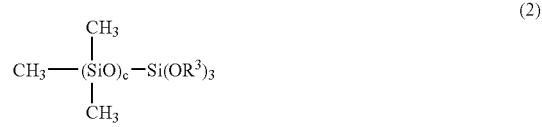

wherein, each $R^3$ represents, independently, an alkyl group of 1 to 6 carbon atoms, and c represents an integer from 5 to 100, and
   wherein a part or the whole of said component (G-2) is mixed at the step (i), and the remainder of said component (G-2), if present, is added at the step (iii).

6. A heat conductive cured product obtained by treating the composition according to claim 1 at a temperature within a range from 80 to 180° C.

7. A method of producing a heat conductive cured product, comprising the step of treating the composition according to claim 1 at a temperature within a range from 80 to 180° C.

8. A method of conducting heat from a heat generating electronic component to a heat radiating member, comprising the step of sandwiching the heat conductive cured product according to claim 6 between the heat generating electronic component and the heat radiating member.

9. A semiconductor device comprising a heat generating electronic component, a heat radiating member, and a heat conductive layer formed from a cured product of the composition according to claim 1, wherein said heat generating electronic component and said heat radiating member are bonded together via said heat conductive layer.

10. A method of producing the semiconductor device according to claim 9, comprising:
    (a) applying said composition to a surface of said heat generating electronic component, thus forming a coating layer of said composition on said surface, (b) securing said heat radiating member to said coating layer by pressure welding, and
(c) treating a thus obtained structure at a temperature of 80 to 180° C., thus curing said coating layer and generating said heat conductive layer.

11. An article, comprising:
a heat conductive layer comprising the heat conductive cured product according to claim 6,
a heat generating electronic component, and
a heat radiating member,
said heat conductive layer being sandwiched between said heat generating electronic component and said heat radiating member.

\* \* \* \* \*